United States Patent
Chen et al.

(10) Patent No.: US 11,557,971 B2
(45) Date of Patent: Jan. 17, 2023

(54) SWITCHING REGULATOR USING PROTECTION CIRCUIT FOR AVOIDING VOLTAGE STRESS AND ASSOCIATED POWER MANAGEMENT INTEGRATED CIRCUIT

(71) Applicant: MEDIATEK INC., Hsin-Chu (TW)

(72) Inventors: Wei-Chung Chen, Hsinchu (TW); Kuo-Chun Hsu, Hsinchu (TW); Chen Tsou, Hsinchu (TW); Chao-Chang Chiu, Hsinchu (TW); Chih-Wei Chang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/084,663

(22) Filed: Oct. 30, 2020

(65) Prior Publication Data
US 2021/0143736 A1 May 13, 2021

Related U.S. Application Data

(60) Provisional application No. 62/931,961, filed on Nov. 7, 2019.

(51) Int. Cl.
H02M 3/158 (2006.01)
H02M 1/32 (2007.01)

(52) U.S. Cl.
CPC .............. *H02M 3/158* (2013.01); *H02M 1/32* (2013.01)

(58) Field of Classification Search
CPC .............................. H02M 1/32; H02M 3/158
See application file for complete search history.

(56) References Cited

U.S. PATENT DOCUMENTS

| 10,270,342 | B2* | 4/2019 | Pullen | H02M 1/088 |
| 2007/0139839 | A1* | 6/2007 | Yoshihara | H03F 1/523 |
| | | | | 361/93.1 |
| 2011/0043955 | A1 | 2/2011 | Noda | |
| 2011/0148200 | A1 | 6/2011 | Burns | |
| 2017/0221879 | A1* | 8/2017 | Wang | H01L 27/0288 |
| 2017/0373592 | A1* | 12/2017 | Takahashi | H02M 3/07 |

FOREIGN PATENT DOCUMENTS

| TW | 201805757 A | 2/2018 |
| WO | 2011/064169 A1 | 6/2011 |
| WO | 2017/082885 A1 | 5/2017 |

* cited by examiner

*Primary Examiner* — Rafael O De Leon Domenech
(74) *Attorney, Agent, or Firm* — Winston Hsu

(57) ABSTRACT

A switching regulator includes a first switch circuit, a second switch circuit, and a protection circuit. The first switch circuit has a first connection node coupled to a first reference voltage, and a second connection node coupled to one end of an inductor. The second switch circuit has a first connection node coupled to a second reference voltage, and a second connection node coupled to the one end of the inductor. The protection circuit senses a voltage level at the first connection node of the first switch circuit, and selectively enables an auxiliary current path in response to the voltage level at the first connection node of the first switch circuit, wherein the auxiliary current path and at least the first switch circuit are arranged in a parallel connection fashion.

19 Claims, 15 Drawing Sheets

SWITCHING REGULATOR USING PROTECTION CIRCUIT FOR AVOIDING VOLTAGE STRESS AND ASSOCIATED POWER MANAGEMENT INTEGRATED CIRCUIT

CROSS REFERENCE TO RELATED APPLICATIONS

This application claims the benefit of U.S. provisional application No. 62/931,961, filed on Nov. 7, 2019 and incorporated herein by reference.

BACKGROUND

The present invention relates to a voltage regulator design, and more particularly, to a switching regulator using a protection circuit for avoiding voltage stress and an associated power management integrated circuit (PMIC).

Switching regulators are widely used in various electronic apparatuses to supply appropriate voltages to electronic circuits used inside the electronic apparatuses. For example, a switching regulator is a voltage regulator that uses switching elements to transform the incoming power supply into a pulsed voltage, which is then smoothed using passive components such as inductors, capacitors, and/or resistors. The switching elements may be implemented by metal-oxide-semiconductor (MOS) transistors. A safe operating area (SOA) is the voltage and current conditions over which a MOS transistor operates without permanent damage or degradation. The MOS transistor must not be exposed to conditions outside the safe operating area even for an instant. However, there are parasitic resistors, inductors, and capacitors in the power path. During switching, the MOS transistor implemented in the switching regulator may suffer from SOA violation due to voltage bouncing resulting from the parasitic resistors, inductors, and capacitors in the power path. One typical solution may protect the switching regulator from SOA violation at the expense of power efficiency. Furthermore, the typical solution requires a complex hardware detector, and is hard to determine an optimum control setting for protecting the switching element. Thus, there is a need for an innovative switching regulator which has a simple detector design and can maintain the power efficiency while obeying the SOA requirement.

SUMMARY

One of the objectives of the claimed invention is to provide a switching regulator using a protection circuit for avoiding voltage stress and an associated power management integrated circuit (PMIC).

According to a first aspect of the present invention, an exemplary switching regulator is disclosed. The exemplary switching regulator includes a first switch circuit, a second switch circuit, and a protection circuit. The first switch circuit has a first connection node coupled to a first reference voltage, and a second connection node coupled to one end of an inductor. The second switch circuit has a first connection node coupled to a second reference voltage that is different from the first reference voltage, and a second connection node coupled to said one end of the inductor. The protection circuit is arranged to sense a voltage level at the first connection node of the first switch circuit, and selectively enable an auxiliary current path in response to the voltage level at the first connection node of the first switch circuit, wherein the auxiliary current path and at least the first switch circuit are arranged in a parallel connection fashion.

According to a second aspect of the present invention, an exemplary power management integrated circuit (PMIC) is disclosed. The exemplary PMIC includes a first pin, a second pin, a third pin, and a switching regulator. The first pin is arranged to receive a first reference voltage. The second pin is arranged to receive a second reference voltage that is different from the first reference voltage. The third pin is arranged to output a pulsed voltage. The switching regulator is arranged to generate the pulsed voltage. The switching regulator includes a first switch circuit, a second switch circuit, and a protection circuit. The first switch circuit has a first connection node coupled to the first pin, and a second connection node coupled to the third pin. The second switch circuit has a first connection node coupled to the second pin, and a second connection node coupled to the third pin. The protection circuit is arranged to sense a voltage level at the first connection node of the first switch circuit, and selectively enable an auxiliary current path in response to the voltage level at the first connection node of the first switch circuit, wherein the auxiliary current path and at least the first switch circuit are arranged in a parallel connection fashion.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
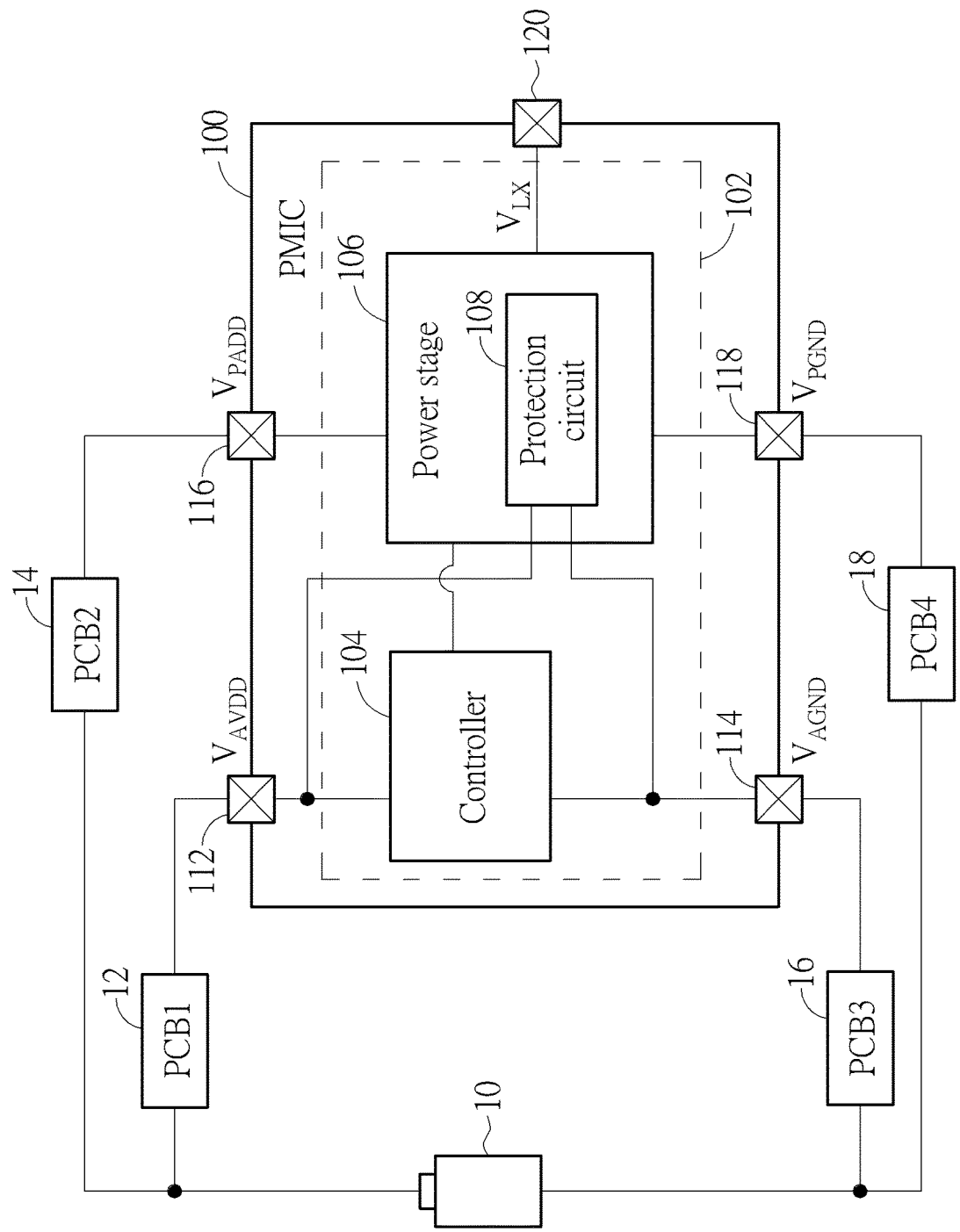
FIG. 1 is a diagram illustrating a power management integrated circuit (PMIC) according to an embodiment of the present invention.

FIG. 1 is a diagram illustrating a power management integrated circuit (PMIC) according to an embodiment of the present invention. The PMIC 100 is a chip that may be used by an electronic device for providing regulated voltages to other components in the same electronic device. In this embodiment, the PMIC 100 is employed by a mobile device such as a cellular phone, a tablet, or a wearable device. Hence, the mobile device is powered by a battery 10. As shown in FIG. 1, the PMIC 100 includes a switching regulator 102, where the switching regulator 102 includes a controller 104 and a power stage 106. The controller 104 is a control circuit that may employ a pulse width modulation (PWM) scheme or other control scheme to control conductance states (i.e., on/off states) of switching elements (e.g., transistors) in the power stage 106. In addition to switching elements (e.g., transistors), the power stage 106 includes the proposed protection circuit 108 to ensure that the switching elements (e.g., transistors) can meet the SOA requirement.

The supply voltage of the controller 104 and the supply voltage of the power stage 106 may be provided separately. Similarly, the ground voltage of the controller 104 and the ground voltage of the power stage 106 may be provided separately. The PMIC 100 has a plurality of pins 112, 114, 116, 118 for receiving a plurality of reference voltages $V_{AVDD}$, $V_{AGND}$, $V_{PVDD}$, $V_{PGND}$, respectively. Specifically, the pin 112 is a power pin arranged to receive a supply voltage (e.g., $V_{AVDD}$) needed by the controller 104, the pin 114 is a ground pin arranged to receive a ground voltage (e.g., $V_{AGND}$) needed by the controller 104, the pin 116 is another power pin arranged to receive a supply voltage (e.g., $V_{PVDD}$) needed by the power stage 106, and the pin 118 is another ground pin arranged to receive a ground voltage (e.g., $V_{PGND}$) needed by the power stage 106. The supply voltage $V_{AVDD}$ is provided via circuit components on a first printed circuit board (denoted by "PCB1") 12, the supply voltage $V_{PVDD}$ is provided via circuit components on a second printed circuit board (denoted by "PCB2") 14, the ground voltage $V_{AGND}$ is provided via circuit components on a third printed circuit board (denoted by "PCB3") 16, and the ground voltage $V_{PVDD}$ is provided via circuit components on a fourth printed circuit board (denoted by "PCB4") 18. The PMIC 100 further includes a pin 120 that is a voltage output pin used to output a pulsed voltage $V_{LX}$ generated from the power stage 106 to a load circuit. For example, the load circuit may be connected to the pin 120 via an inductor.

The supply voltages $V_{AVDD}$ and $V_{PVDD}$ may be designed to have the same steady-state voltage value, and the ground voltages $V_{AGND}$ and $V_{PGND}$ may be designed to have the same steady-state voltage value. However, due to inherent characteristics of the controller 104 and the power stage 106, the noise level of the supply voltage $V_{AVDD}$ is lower than the noise level of the supply voltage $V_{PVDD}$, and the noise level of the ground voltage $V_{AGND}$ is lower than the noise level of the ground voltage $V_{PGND}$. In other words, the supply voltage $V_{AVDD}$ is much cleaner than the supply voltage $V_{AVDD}$, and the ground voltage $V_{AGND}$ is much cleaner than the ground voltage $V_{PGND}$. In one exemplary SOA protection design, the protection circuit 108 may use the supply voltage $V_{AVDD}$ as a reference to monitor the voltage bouncing on the supply voltage at the pin 116. In another exemplary SOA protection design, the protection circuit 108 may use the ground supply voltage $V_{AGND}$ as a reference to monitor the voltage bouncing on the ground voltage at the pin 118. However, these are for illustrative purposes only, and are not meant to be limitations of the present invention. In practice, any switching regulator design using the proposed SOA protection design falls within the scope of the present invention. For example, the protection circuit 108 may use a higher steady-state reference voltage level to monitor the voltage bouncing on the supply voltage at the pin 116. For another example, the protection circuit 108 may use a lower steady-state reference voltage level to monitor the voltage bouncing on the ground voltage at the pin 118. Further details of the proposed SOA protection design are described with reference to the accompanying drawings.

Figure 2:
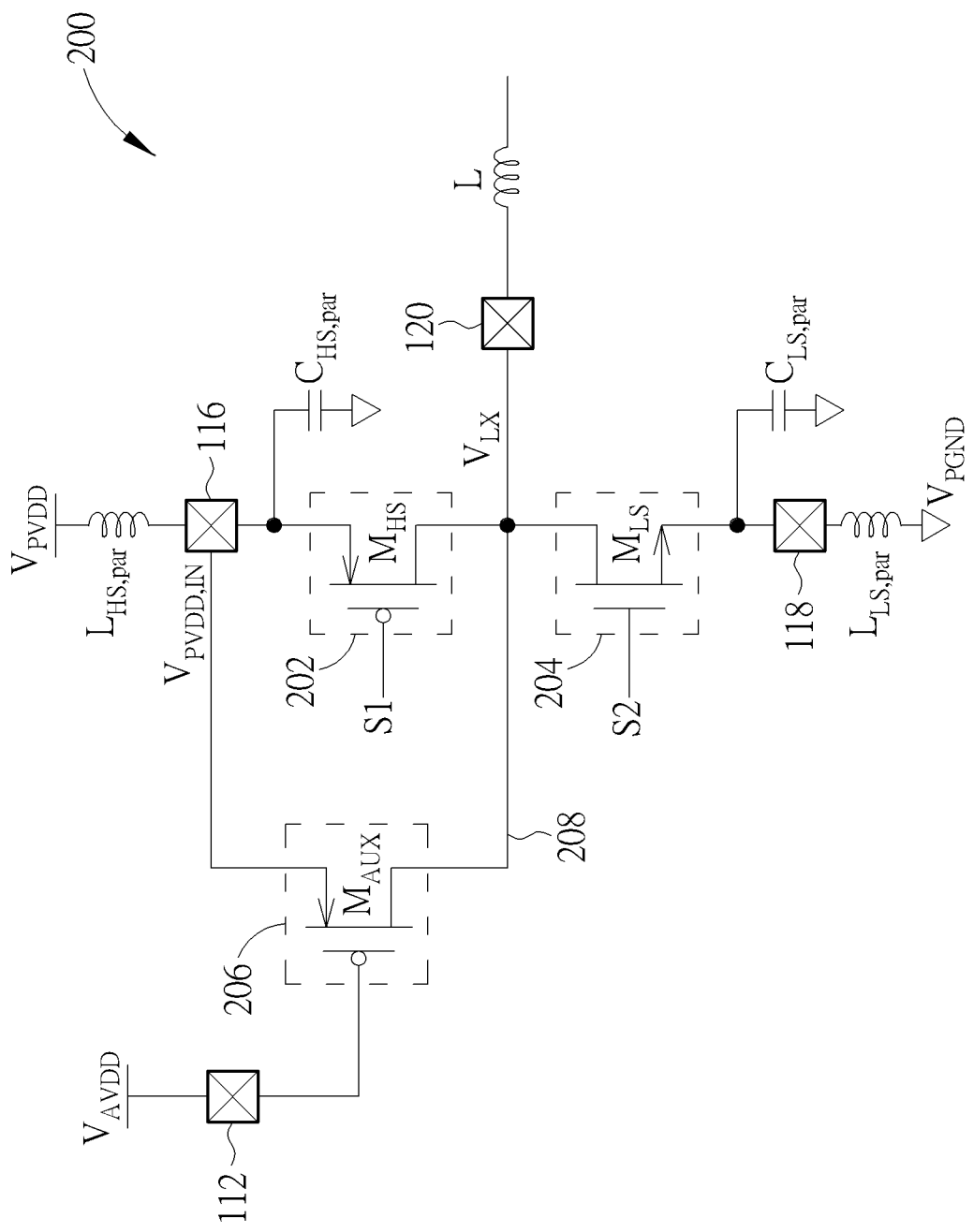
FIG. 2 is a circuit diagram illustrating a first switching regulator with high-side safe operating area (SOA) protection according to an embodiment of the present invention.

FIG. 2 is a circuit diagram illustrating a first switching regulator with high-side SOA protection according to an embodiment of the present invention. The switching regulator 102 shown in FIG. 1 may be implemented using the switching regulator 200. For clarity and simplicity, only the circuit components pertinent to the present invention are illustrated in FIG. 2. In practice, the switching regulator 200 may include other circuit components. As shown in FIG. 2, the switching regulator 200 includes a plurality of switch circuits 202, 204 and a protection circuit 206. The switch circuits 202 and 204 act as switching elements of the power stage 106, and the protection circuit 108 of the power stage 106 may be implemented by the protection circuit 206. The switch circuit 202 is a high-side (HS) switch having a first connection node coupled to a first reference voltage (e.g., supply voltage $V_{PVDD}$) and a second connection node coupled to one end of an off-chip inductor L, where the supply voltage $V_{PVDD}$ is received by the switch circuit 202 via the pin 116, and the off-chip inductor L is coupled to the switch circuit 202 via the pin 120. In addition, a conductance state (i.e., on/off state) of the switch circuit 202 is controlled by one switching control signal S1. For example, the switching control signal S1 is generated from the controller 104 shown in FIG. 1.

The switch circuit 204 is a low-side (LS) switch having a first connection node coupled to a second reference voltage (e.g., ground voltage $V_{PGND}$) that is different from the first reference voltage (e.g., supply voltage $V_{PVDD}$), and a second connection node coupled to one end of the off-chip inductor L, where the ground voltage $V_{PGND}$ is received by the switch circuit 204 via the pin 118. In addition, a conductance state (i.e., on/off state) of the switch circuit 204 is controlled by another switching control signal S2. For example, the switching control signal S2 is generated from the controller 104 shown in FIG.

The protection circuit 206 is arranged to sense a voltage level $V_{PVDD,IN}$ at the first connection node of the switch circuit 202, and selectively enable an auxiliary current path 208 in response to the voltage level $V_{PVDD,IN}$ at the first connection node of the switch circuit 202, wherein the auxiliary current path 208 and the switch circuit 202 are arranged in a parallel connection fashion.

In this embodiment, the switch circuit 202 is implemented by a P-channel metal-oxide-semiconductor (PMOS) transistor $M_{HS}$ with a source node coupled to the pin 116, a drain node coupled to the pin 120, and a gate node coupled to a controller (e.g., controller 104 shown in FIG. 1); the switch circuit 204 is implemented by an N-channel metal-oxide-semiconductor (NMOS) transistor $M_{LS}$ with a source node coupled to the pin 118, a drain node coupled to the pin 120, and a gate node coupled to a controller (e.g., controller 104 shown in FIG. 1); and the protection circuit 206 is implemented by an auxiliary transistor that is a PMOS transistor $M_{AUX}$ with a source node coupled to the pin 116, a drain node coupled to the pin 120, and a gate node coupled to the pin 112.

The parasitic inductors resulting from PCB and semiconductor package are represented by $L_{HS,par}$ and $L_{LS,par}$, and the parasitic capacitors resulting from PCB, semiconductor package and switch circuits 202 and 204 are represented by $C_{HS,par}$ and $C_{LS,par}$.

Figure 3:
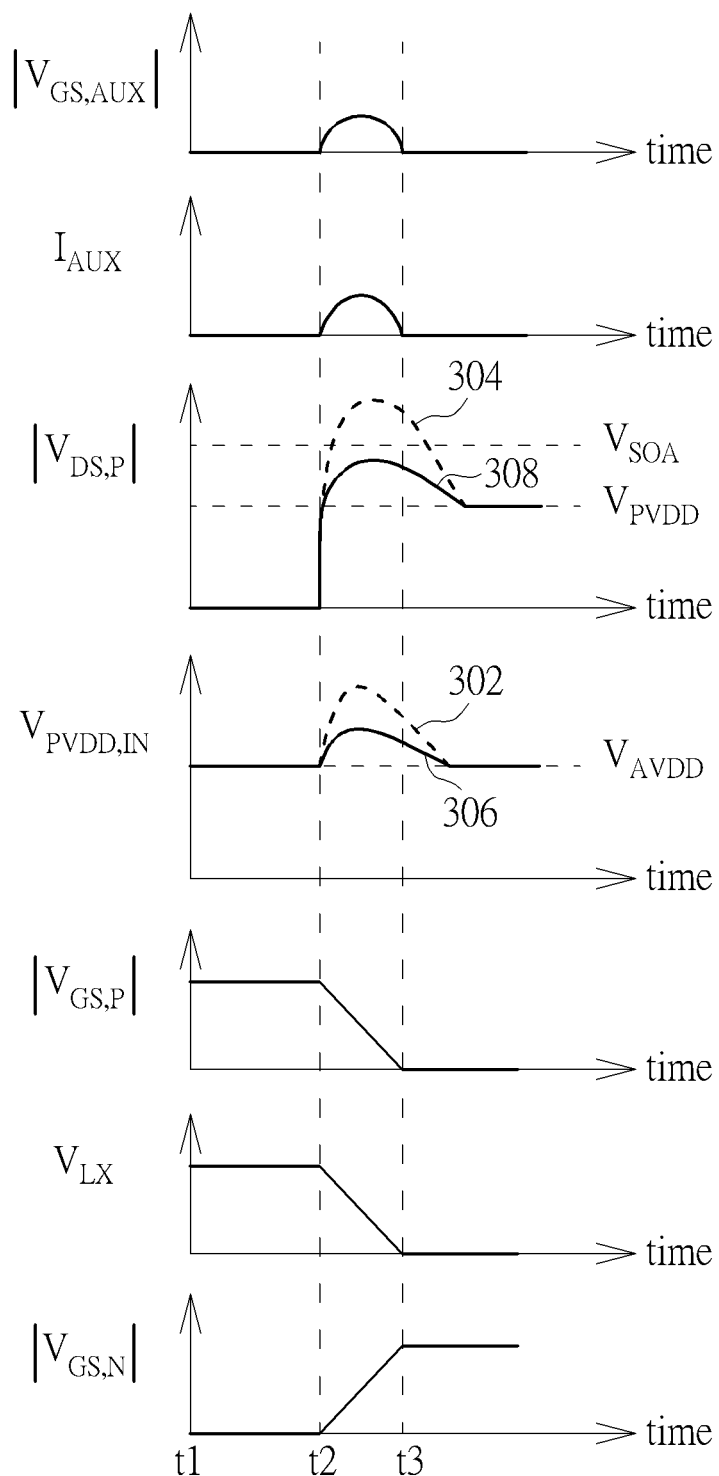
FIG. 3 is a diagram illustrating waveforms of various voltages and an auxiliary current in the switching regulator shown in FIG. 2 according to an embodiment of the present invention.
Figure 4:
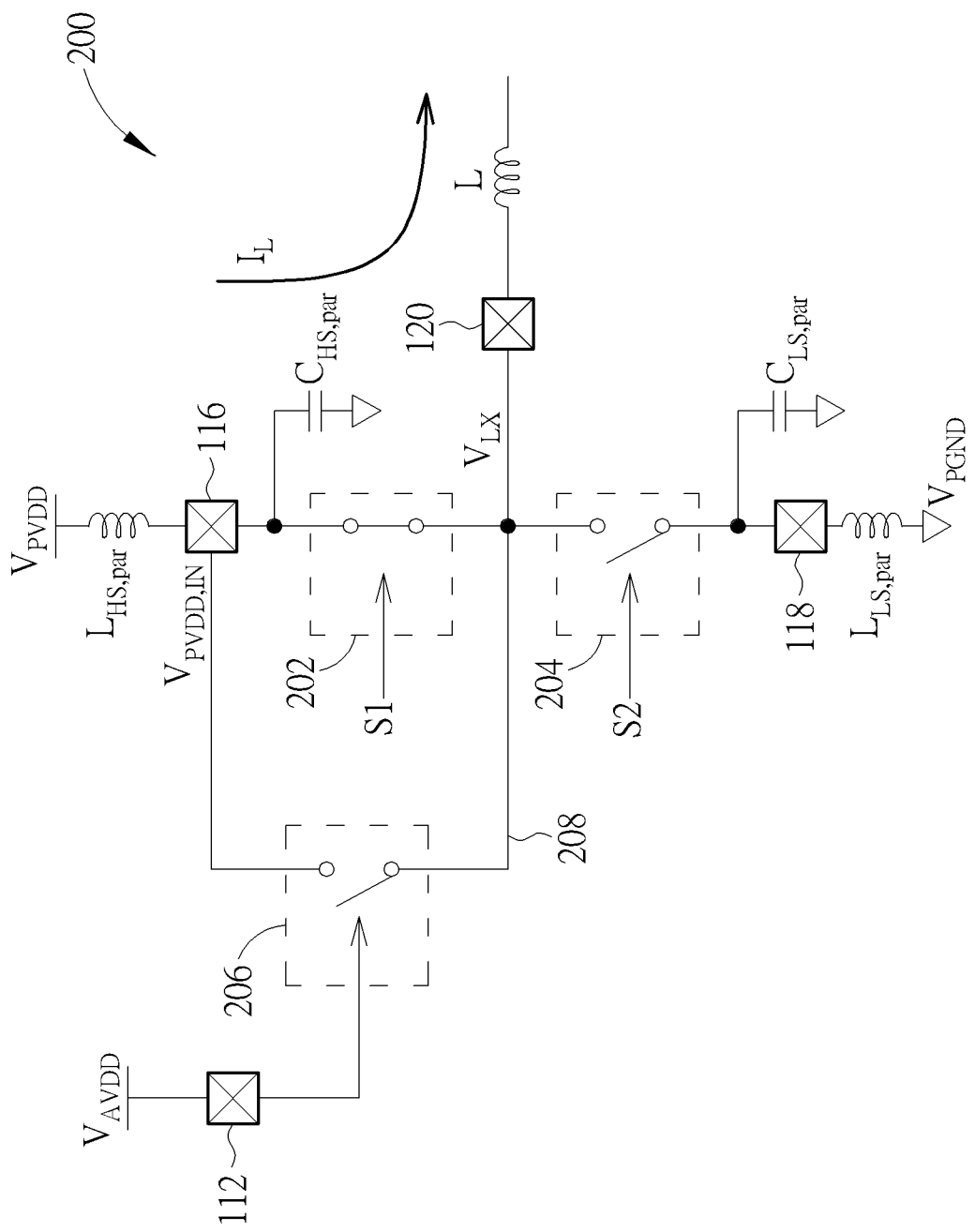
FIG. 4 is a diagram illustrating the switching regulator in FIG. 2 that operates during a first period within a voltage regulation cycle.

Please refer to FIG. 2 in conjunction with FIGS. 3-4. FIG. 3 is a diagram illustrating waveforms of various voltages and an auxiliary current in the switching regulator 200 shown in FIG. 2 according to an embodiment of the present invention. FIG. 4 is a diagram illustrating the switching regulator 200 in FIG. 2 that operates during a first period t1-t2 within a voltage regulation cycle. An absolute value of a gate-source voltage of the PMOS transistor $M_{AUX}$ is denoted by $|V_{GS,AUX}|$. An absolute value of a gate-source voltage of the PMOS transistor $M_{HS}$ is denoted by $|V_{GS,P}|$. An absolute value of a gate-source voltage of the NMOS transistor $M_{LS}$ is denoted by $V_{GS,N}|$. An absolute value of a drain-source voltage of the PMOS transistor $M_{HS}$ denoted by $|V_{DS,P}|$.

During the first period t1-t2, the switch circuit 202 (particularly, PMOS transistor $M_{HS}$) is switched on, and the switch circuit 204 (particularly, NMOS transistor $M_{LS}$) is switched off. Hence, the switching regulator 200 generates one current $I_L$ passing through the parasitic inductor $L_{HS,par}$, the switch circuit 202 (particularly, PMOS transistor $M_{HS}$), and the inductor L. In this way, the pulsed voltage $V_{LX}$ has a high voltage level. Since the voltage level $V_{PVDD,IN}$ at the first connection node of the switch circuit 202 is approximately equal to the supply voltage $V_{AVDD}$ received by the protection circuit 206, the protection circuit 206 (particularly, PMOS transistor $M_{AUX}$) is switched off, meaning that the auxiliary current path 208 is not enabled between the first connection node and the second connection node of the switch circuit 202.

Figure 5:
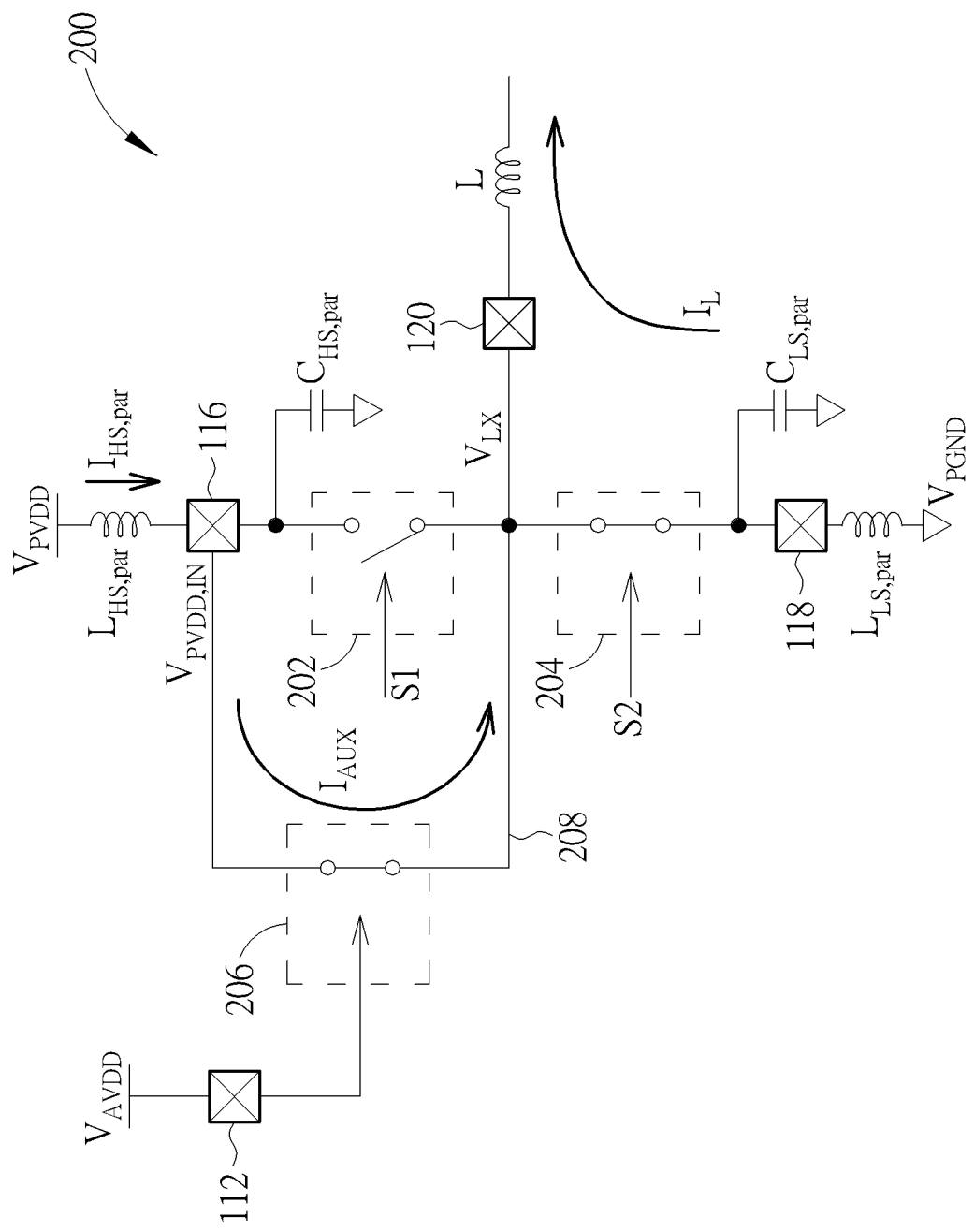
FIG. 5 is a diagram illustrating the switching regulator in FIG. 2 that operates during a second period within the voltage regulation cycle.

Please refer to FIG. 2 in conjunction with FIG. 3 and FIG. 5. FIG. 5 is a diagram illustrating the switching regulator 200 in FIG. 2 that operates during a second period t2-t3 within the voltage regulation cycle. During the second period t2-t3 immediately following the first period t1-t2, the switching control signal S1 is set for switching off the switch circuit 202 (particularly, PMOS transistor $M_{HS}$), and the switching control signal S2 is set for switching on the switch circuit 204 (particularly, NMOS transistor $M_{LS}$). Hence, the switching regulator 200 generates the current $I_L$ passing through the parasitic inductor $L_{LS,par}$, the switch circuit 204 (particularly, NMOS transistor $M_{LS}$), and the inductor L. In this way, the pulsed voltage $V_{LX}$ has a transition from a high voltage level to a low voltage level. Since the switch circuit 202 (particularly, PMOS transistor $M_{HS}$) is controlled to be switched off and the current passing through the parasitic inductor $L_{HS,par}$ should be continuous, the parasitic inductor $L_{HS,par}$ still has the current $I_{HS,par}$ passing there through, thus increasing the voltage level $V_{PVDD,IN}$ at the first connection node of the switch circuit 202. In a case where the proposed protection circuit 206 is omitted, the voltage level $V_{PVDD,IN}$ at the first connection node of the switch circuit 202 is boosted significantly, as indicated by the dotted line 302. As illustrated by the dotted line 304, the absolute value of the drain-source voltage of the PMOS transistor $M_{HS}$ (which is denoted by $|V_{DS,P}|$) will exceed the SOA voltage $V_{SOA}$, thus resulting in damage of the PMOS transistor $M_{HS}$.

To address this issue, the proposed protection circuit 206 is implemented to provide SOA protection. When the current $I_{HS,par}$ passing through the parasitic inductor $L_{HS,par}$, the voltage level $V_{PVDD,IN}$ at the first connection node of the switch circuit 202 is increased to be higher than the supply voltage $V_{AVDD}$ acting a gate voltage of the PMOS transistor $M_{AUX}$, and the absolute value of the gate-source voltage of the PMOS transistor $M_{AUX}$ (which is denoted by $|V_{GS,AUX}|$) is increased accordingly. Once the absolute value of the gate-source voltage of the PMOS transistor $M_{AUX}$ (which is denoted by $|V_{GS,AUX}|$) exceeds an absolute value of a threshold voltage $|V_{TH}|$ of the PMOS transistor $M_{AUX}$ the protection circuit 206 (particularly, PMOS transistor $M_{AUX}$) is automatically switched on, thereby enabling the auxiliary current path 208 between the first connection node and the second connection node of the switch circuit 202. In other words, the protection circuit 206 provides another current path for $I_{HS,par}$. Since a part of the current $I_{HS,par}$ (which is denoted by $I_{AUX}$) passes through the auxiliary current path 208, the voltage bouncing at the first connection node of the switch circuit 202 is mitigated, as illustrated by the solid line 306. In this way, the absolute value of the drain-source voltage of the PMOS transistor $M_{HS}$ (which is denoted by $|V_{DS,P}|$) will not exceed the SOA voltage $V_{SOA}$, as illustrated by the dotted line 308.

In above embodiment shown in FIG. 2, the protection circuit 206 is implemented by PMOS transistor $M_{AUX}$. However, this is for illustrative purposes only, and is not meant to be a limitation of the present invention. Alternatively, the protection circuit 206 may be implemented by a PNP bipolar transistor or other transistor that can be selectively turned on according to difference between the auxiliary reference voltage (e.g., $V_{AVDD}$) and the voltage level $V_{PVDD,IN}$ at the first connection node of the switch circuit 202.

The proposed protection circuit 206 has a simple design that can automatically enable the auxiliary current path 208 according to a difference between the auxiliary reference voltage (e.g., $V_{AVDD}$) and the voltage level $V_{PVDD,IN}$ at the first connection node of the switch circuit 202. In addition, there is no need to decrease the slew rate of the PMOS transistor $M_{HS}$ for SOA protection, such that the power efficiency of the switching regulator 200 can be maintained under a condition that the PMOS transistor $M_{HS}$ meets the SOA requirement.

The maximum value of the current $I_{HS,par}$ depends on the maximum value of the current $I_L$ required by a load circuit, and also depends on parasitic inductors, capacitors, and resistors resulting from PCB and semiconductor package. Since the proposed protection circuit 206 can ensure that the PMOS transistor $M_{HS}$ meets the SOA requirement, there is no need to limit the maximum current capability for SOA protection and/or to apply limitations to design rules of PCB and semiconductor package for SOA protection.

With regard to the embodiment shown in FIG. 2, the protection circuit 206 is arranged to selectively enable the auxiliary current path 208 coupled between the first connection node of the switch circuit 202 and one end of the inductor L. Since the pulsed voltage $V_{LX}$ is an output of the switching regulator 200 and provided to the inductor L via the pin 120, the power on the parasitic inductor $L_{HS,par}$ can be recycled to the output of the switching regulator 200 through the auxiliary current path 208. However, this is for illustrative purposes only, and is not meant to be a limitation of the present invention. The same objective of providing SOA protection for the switch circuit 202 (particularly, PMOS transistor $M_{HS}$) can be achieved by enabling the auxiliary current path 208 coupled between the first connection node of the switch circuit 202 (particularly, PMOS transistor $M_{HS}$) and one reference voltage (e.g., ground voltage $V_{PGND}$).

Figure 6:
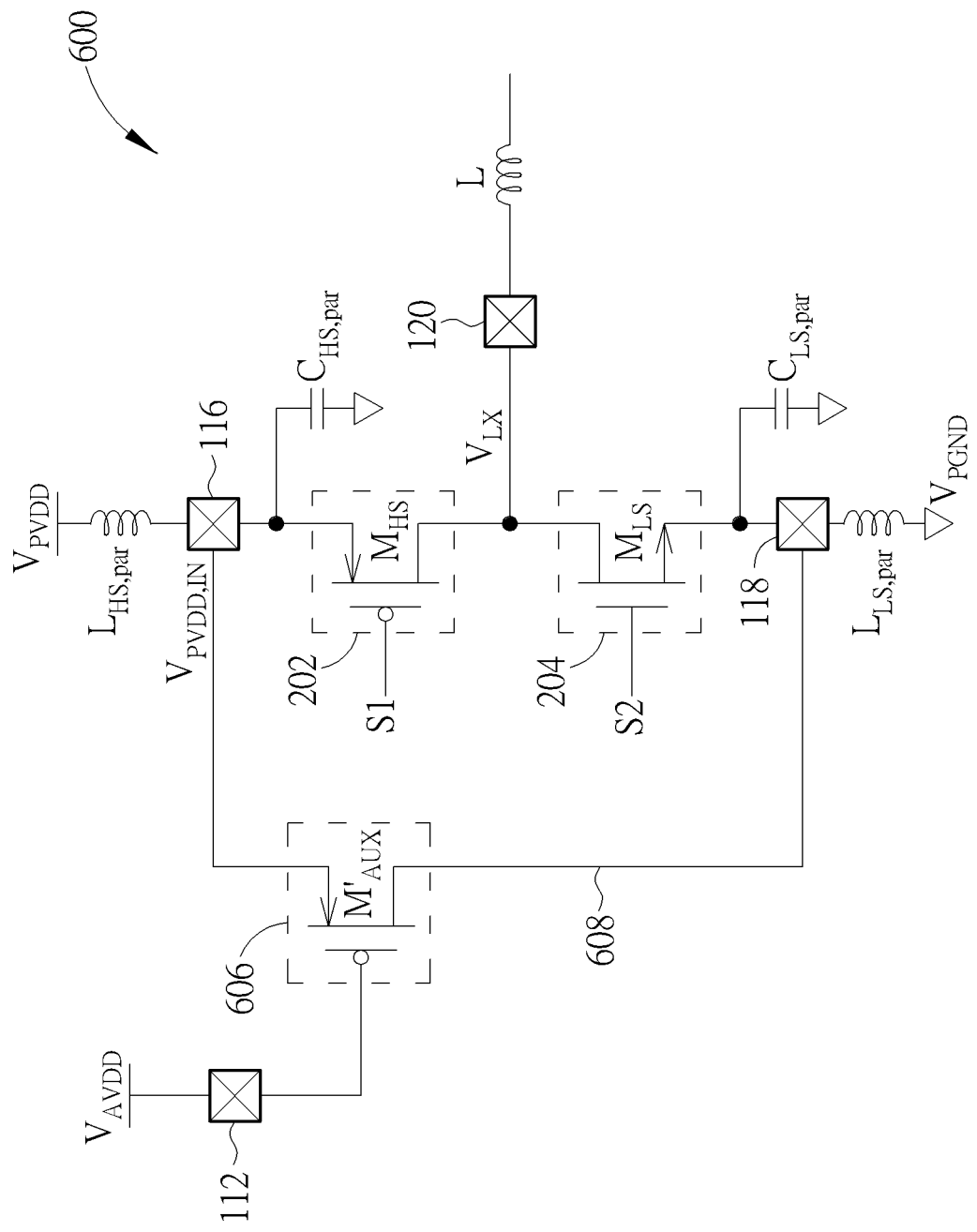
FIG. 6 is a diagram illustrating a second switching regulator with high-side SOA protection according to an embodiment of the present invention.

FIG. 6 is a diagram illustrating a second switching regulator with high-side SOA protection according to an embodiment of the present invention. The major difference between the switching regulators 200 and 600 is that the switching regulator 600 has a protection circuit 606 implemented by an auxiliary transistor that is a PMOS transistor $M'_{AUX}$ with a source node coupled to the pin 116, a drain node coupled to the pin 118, and a gate node coupled to the pin 112. Hence, when an auxiliary current path 608 is enabled, the power on the parasitic inductor $L_{HS,par}$ is not recycled to the output of the switching regulator 600. Alternatively, the protection circuit 606 may be implemented by a PNP bipolar transistor or other transistor that can be selectively turned on according to difference between the auxiliary reference voltage (e.g., $V_{AVDD}$) and the voltage level $V_{PVDD,IN}$ at the first connection node of the switch circuit 202.

Figure 7:
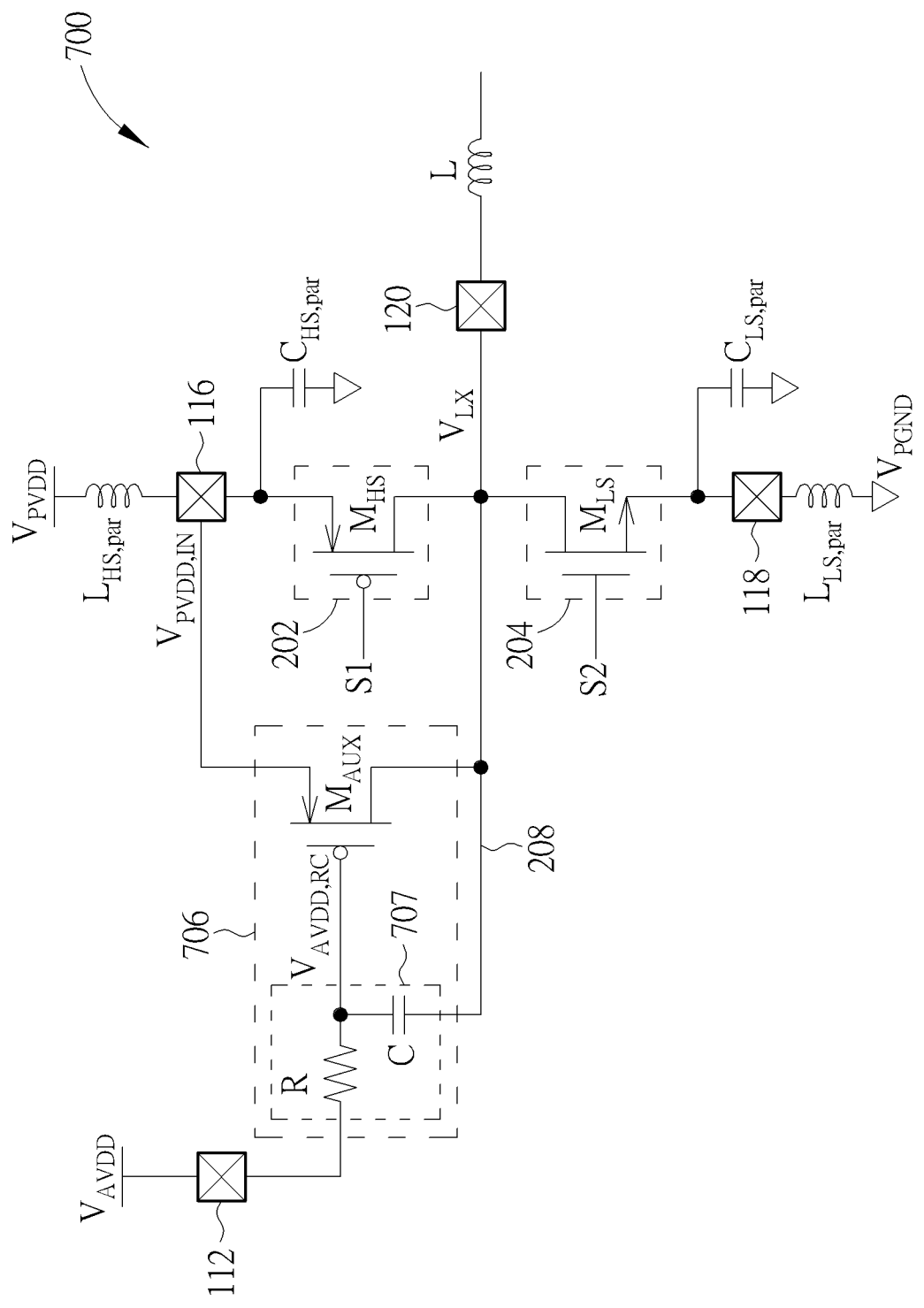
FIG. 7 is a diagram illustrating a third switching regulator with high-side SOA protection according to an embodiment of the present invention.

FIG. 7 is a diagram illustrating a third switching regulator with high-side SOA protection according to an embodiment of the present invention. The major difference between the switching regulators 200 and 700 is that the switching regulator 700 has a protection circuit 706 including a resistor-capacitor (RC) circuit 707 and the aforementioned auxiliary transistor (e.g., PMOS transistor $M_{AUX}$). The RC circuit 707 includes a resistor R and a capacitor C. A first end of the resistor R is coupled to the auxiliary reference voltage (e.g., supply voltage $V_{AVDD}$), and a second end of the resistor R is coupled to the control node of the auxiliary transistor (e.g., PMOS transistor $M_{AUX}$). A first end of the capacitor C is coupled to the control node of the auxiliary transistor (e.g., PMOS transistor $M_{AUX}$), and a second end of the capacitor C is coupled to one end of the inductor L. As shown in FIG. 3 and FIG. 5, the switching control signal S1 is set for switching off the switch circuit 202 (particularly, PMOS transistor $M_{HS}$) and the switching control signal S2 is set for switching on the switch circuit 204 (particularly, NMOS transistor $M_{LS}$) during the second period t2-t3. Hence, the pulsed voltage $V_{LX}$ has a transition from a high voltage level to a low voltage level. Since the pulsed voltage $V_{LX}$ is coupled to the control node of the auxiliary transistor (e.g., PMOS transistor $M_{AUX}$) through the RC circuit 707, the voltage level $V_{AVDD,RC}$ at the control node of the auxiliary transistor (e.g., PMOS transistor $M_{AUX}$) is temporarily pulled low due to the pulsed voltage $V_{LX}$. After the voltage level $V_{AVDD,RC}$ is temporarily pulled low by the pulsed voltage $V_{LX}$, it will be pulled high by the auxiliary reference voltage (e.g., supply voltage $V_{AVDD}$).

Alternatively, the auxiliary transistor (e.g., PMOS transistor $M_{AUX}$) in the protection circuit 706 may be implemented by a PNP bipolar transistor or other transistor that can be selectively turned on according to difference between the voltage level $V_{AVDD,RC}$ at the control node of the auxiliary transistor and the voltage level $V_{PVDD,IN}$ at the first connection node of the switch circuit 202.

Figure 8:
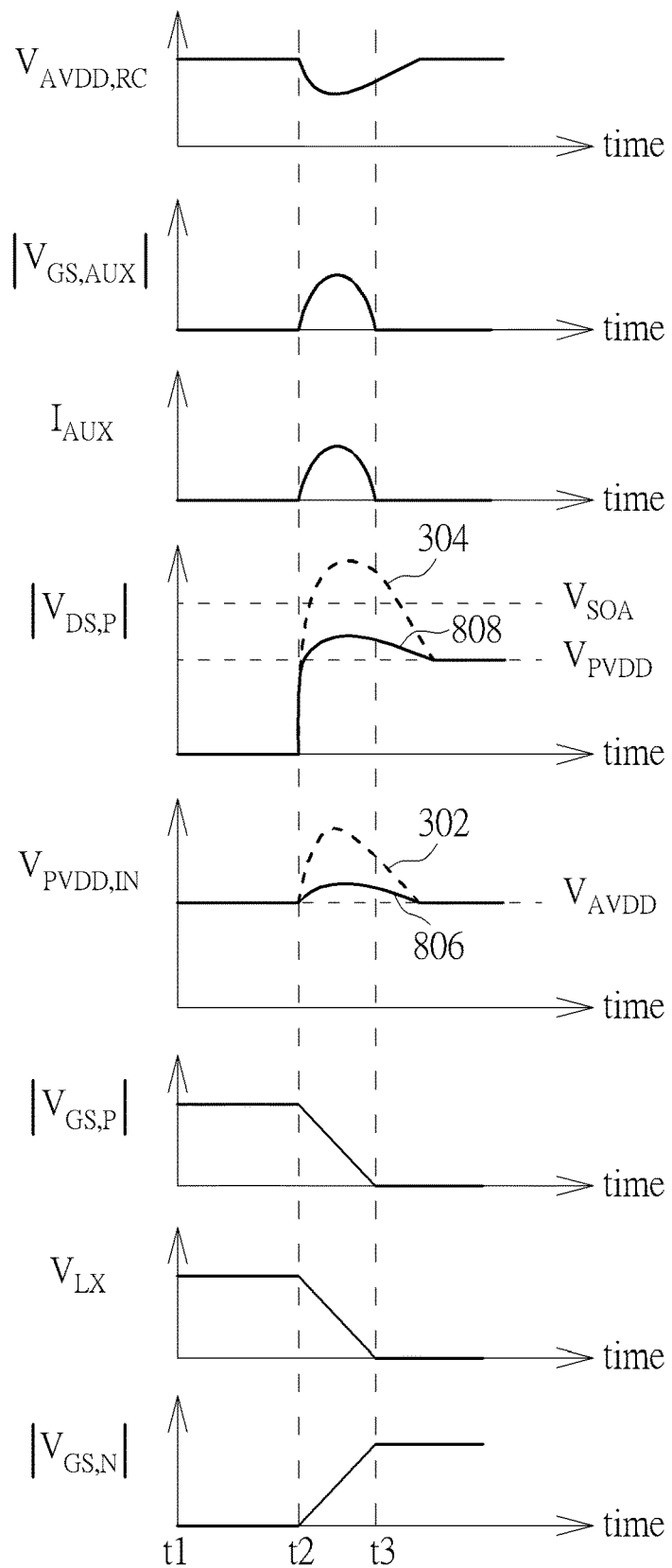
FIG. 8 is a diagram illustrating waveforms of various voltages and an auxiliary current in the switching regulator shown in FIG. 7 according to an embodiment of the present invention.

Please refer to FIG. 7 in conjunction with FIG. 8. FIG. 8 is a diagram illustrating waveforms of various voltages and an auxiliary current in the switching regulator 700 shown in FIG. 7 according to an embodiment of the present invention. When the voltage level $V_{AVDD, RC}$ is temporarily pulled low by the pulsed voltage $V_{LX}$, the gate-source voltage of the PMOS transistor $M_{AUX}$ is increased, thus allowing higher current density on the auxiliary current path 208. Hence, the current $I_{AUX}$ passing through the auxiliary current path 208 is increased, thus resulting in a lower voltage increment of the voltage level $V_{PVDD,IN}$ at the first connection node of the switch circuit 202, as indicated by a dotted line 806. In this way, the voltage bouncing at the first connection node of the switch circuit 202 is mitigated due to a smaller absolute value of the drain-source voltage of the PMOS transistor $M_{HS}$, as illustrated by the dotted line 808. Compared to the design of the protection circuit 206, the design of the protection circuit 706 can provide better SOA protection for the switch circuit 202 (particularly, PMOS transistor $M_{HS}$).

Figure 9:
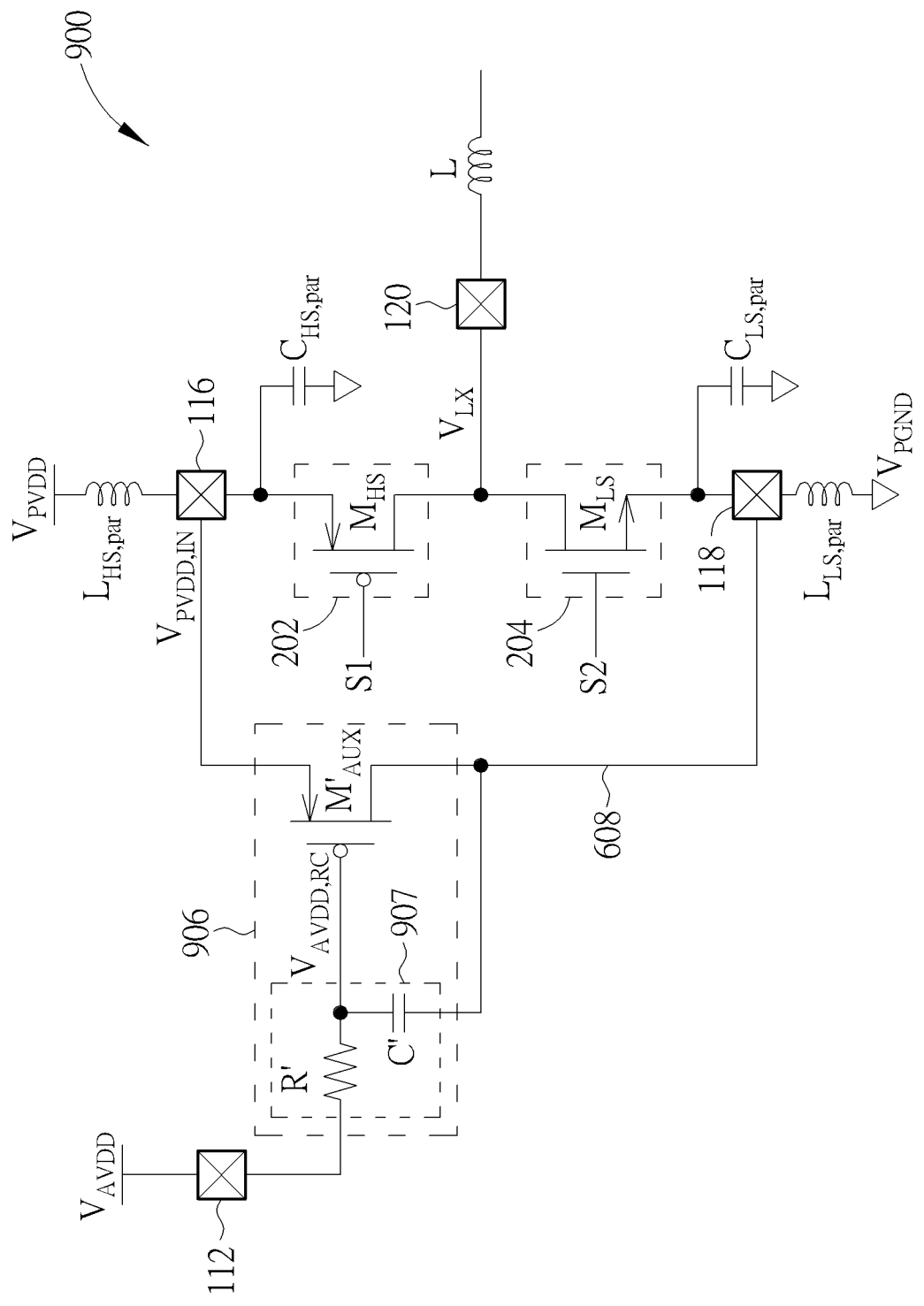
FIG. 9 is a diagram illustrating a fourth switching regulator with high-side SOA protection according to an embodiment of the present invention.

FIG. 9 is a diagram illustrating a fourth switching regulator with high-side SOA protection according to an embodiment of the present invention. The major difference between the switching regulators 600 and 900 is that the switching regulator 900 has a protection circuit 906 including a resistor-capacitor (RC) circuit 907 and the aforementioned auxiliary transistor (e.g., PMOS transistor $M'_{AUX}$) The RC circuit 907 includes a resistor R' and a capacitor C'. A first end of the resistor R' is coupled to the auxiliary reference voltage (e.g., supply voltage $V_{AVDD}$), and a second end of the resistor R' is coupled to the control node of the auxiliary transistor (e.g., PMOS transistor $M'_{AUX}$). A first end of the capacitor C' is coupled to the control node of the auxiliary transistor (e.g., PMOS transistor, $M'_{AUX}$) and a second end of the capacitor C' is coupled to one reference voltage (e.g., ground voltage $V_{PGND}$). As a skilled person in the art can readily understand the principle of the protection circuit 906 after reading above paragraphs directed to the protection circuit 706, further description is omitted here for brevity.

Alternatively, the auxiliary transistor (e.g., PMOS transistor $M'_{AUX}$) in the protection circuit 906 may be implemented by a PNP bipolar transistor or other transistor that can be selectively turned on according to difference between the voltage level $V_{AVDD, RC}$ at the control node of the auxiliary transistor and the voltage level $V_{PVDD, IN}$ at the first connection node of the switch circuit 202.

With regard to the embodiments shown in FIG. 2, FIG. 6, FIG. 7, and FIG. 9, each of the proposed protection circuits 206, 606, 706, and 906 is designed to apply SOA protection to the high-side switch circuit 202. However, these are for illustrative purposes only, and are not meant to be limitations of the present invention. The same SOA protection design can be employed for applying SOA protection to the low-side switch circuit 204.

Figure 10:
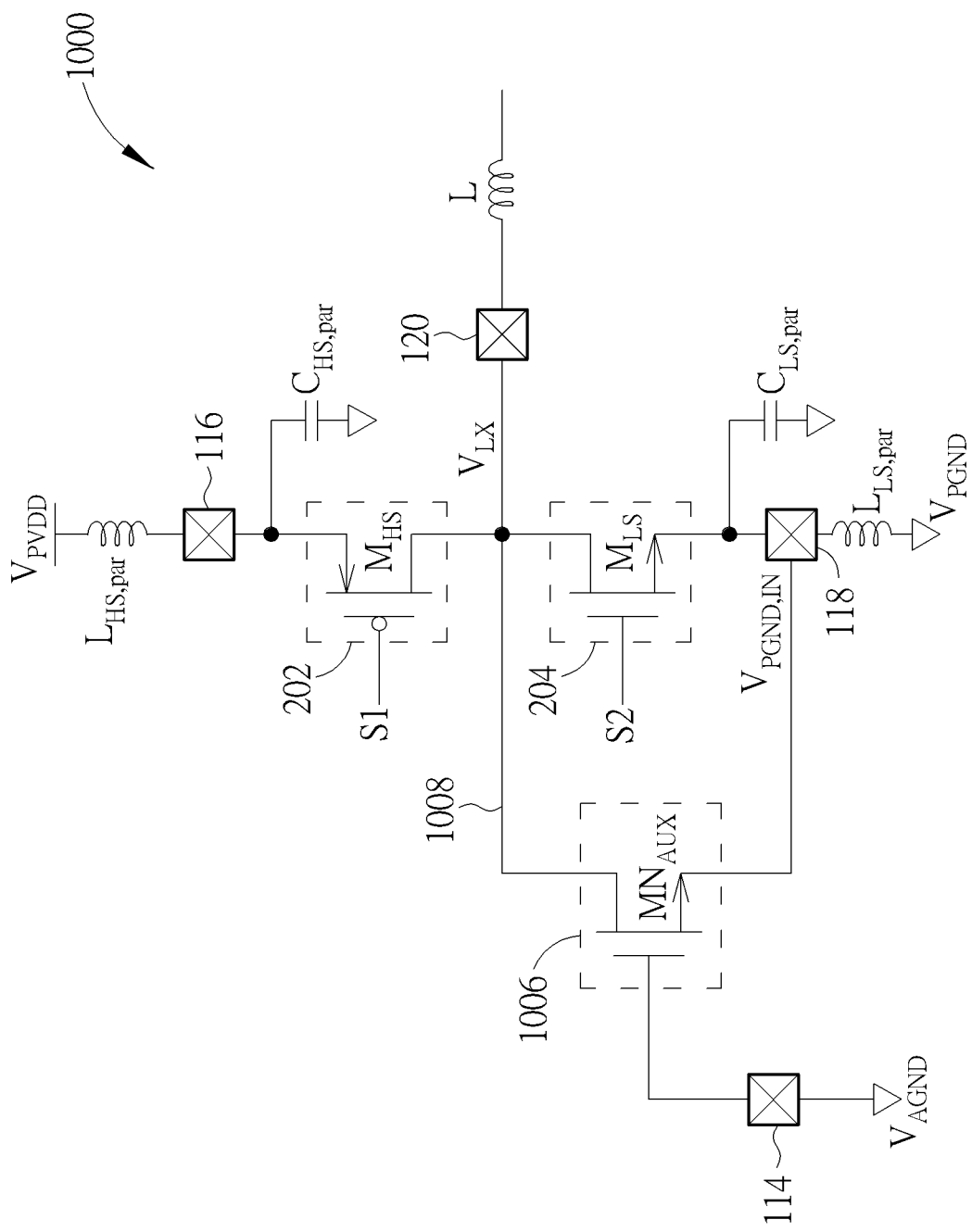
FIG. 10 is a circuit diagram illustrating a first switching regulator with low-side SOA protection according to an embodiment of the present invention.

FIG. 10 is a circuit diagram illustrating a first switching regulator with low-side SOA protection according to an embodiment of the present invention. The switching regulator 102 shown in FIG. 1 may be implemented using the switching regulator 1000. The major difference between the switching regulators 200 and 1000 is that the switching regulator 1000 includes a protection circuit 1006 arranged to sense a voltage level $V_{PGND,IN}$ at the first connection node of the switch circuit 204 and selectively enable an auxiliary current path 1008 in response to the voltage level $V_{PGND,IN}$ at the first connection node of the switch circuit 204, wherein the auxiliary current path 1008 and the switch circuit 204 are arranged in a parallel connection fashion. In this embodiment, the protection circuit 1006 is implemented by an auxiliary transistor that is an NMOS transistor $MN_{AUX}$ with a source node coupled to the pin 118, a drain node coupled to the pin 120, and a gate node coupled to the pin 114.

Figure 11:
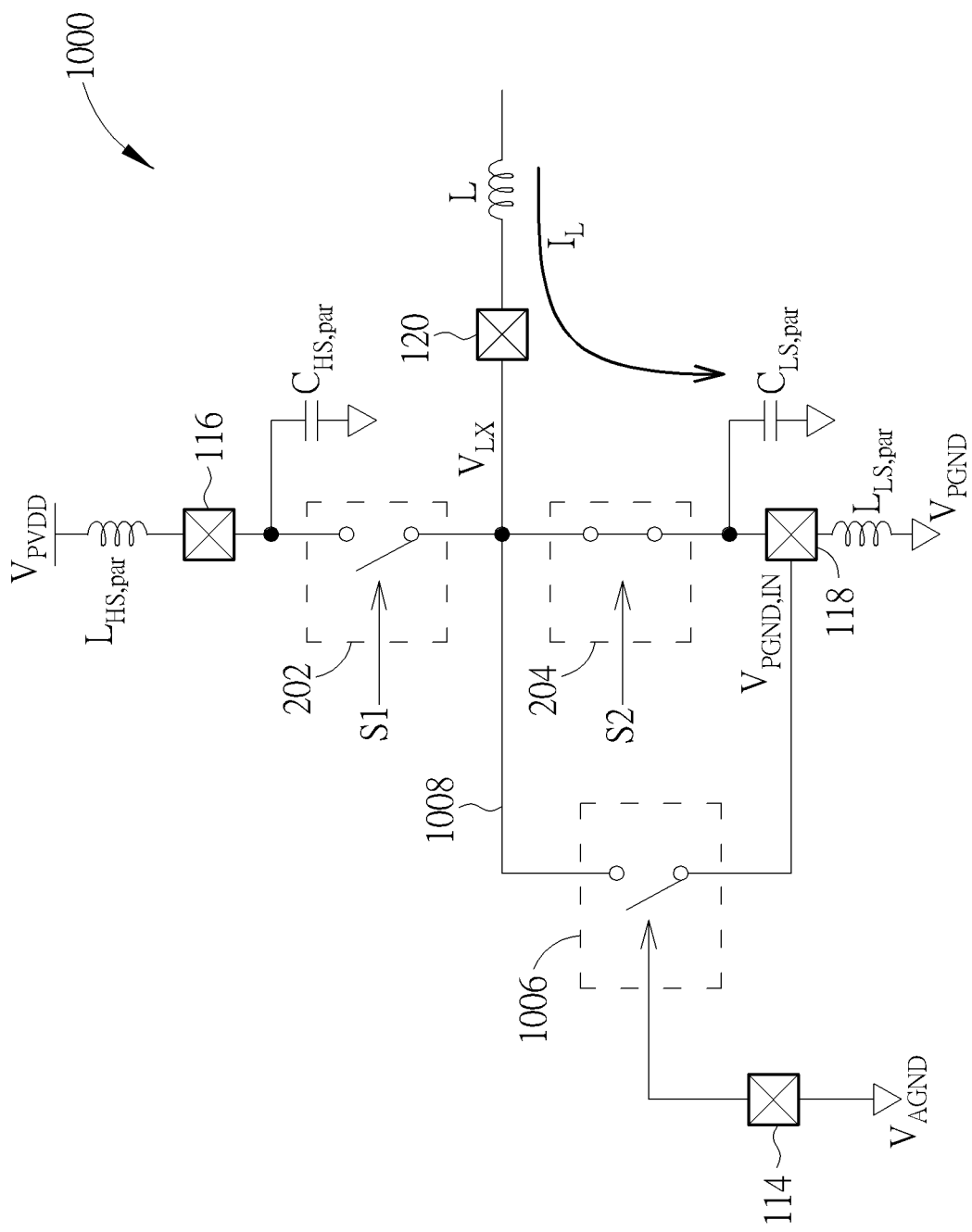
FIG. 11 is a diagram illustrating the switching regulator in FIG. 10 that operates during a first period within a voltage regulation cycle.

Please refer to FIG. 10 in conjunction with FIG. 11. FIG. 11 is a diagram illustrating the switching regulator 1000 in FIG. 10 that operates during a first period within a voltage regulation cycle. During the first period within the voltage regulation cycle, the switch circuit 204 (particularly, NMOS transistor $M_{LS}$) is switched on, and the switch circuit 202 (particularly, PMOS transistor $M_{HS}$) is switched off. Hence, the switching regulator 1000 generates one current $I_L$ passing through the inductor L, the switch circuit 204 (particularly, NMOS transistor $M_{LS}$), and the parasitic inductor $L_{LS,par}$. In this way, the pulsed voltage $V_{LX}$ has a low voltage level. Since the voltage level $V_{PGND,IN}$ at the first connection node of the switch circuit 204 is approximately equal to the ground voltage $V_{AGND}$ received by the protection circuit 1006, the protection circuit 1006 (particularly, NMOS transistor $MN_{AUX}$) is switched off, meaning that the auxiliary current path 1008 is not enabled between the first connection node and the second connection node of the switch circuit 204.

Figure 12:
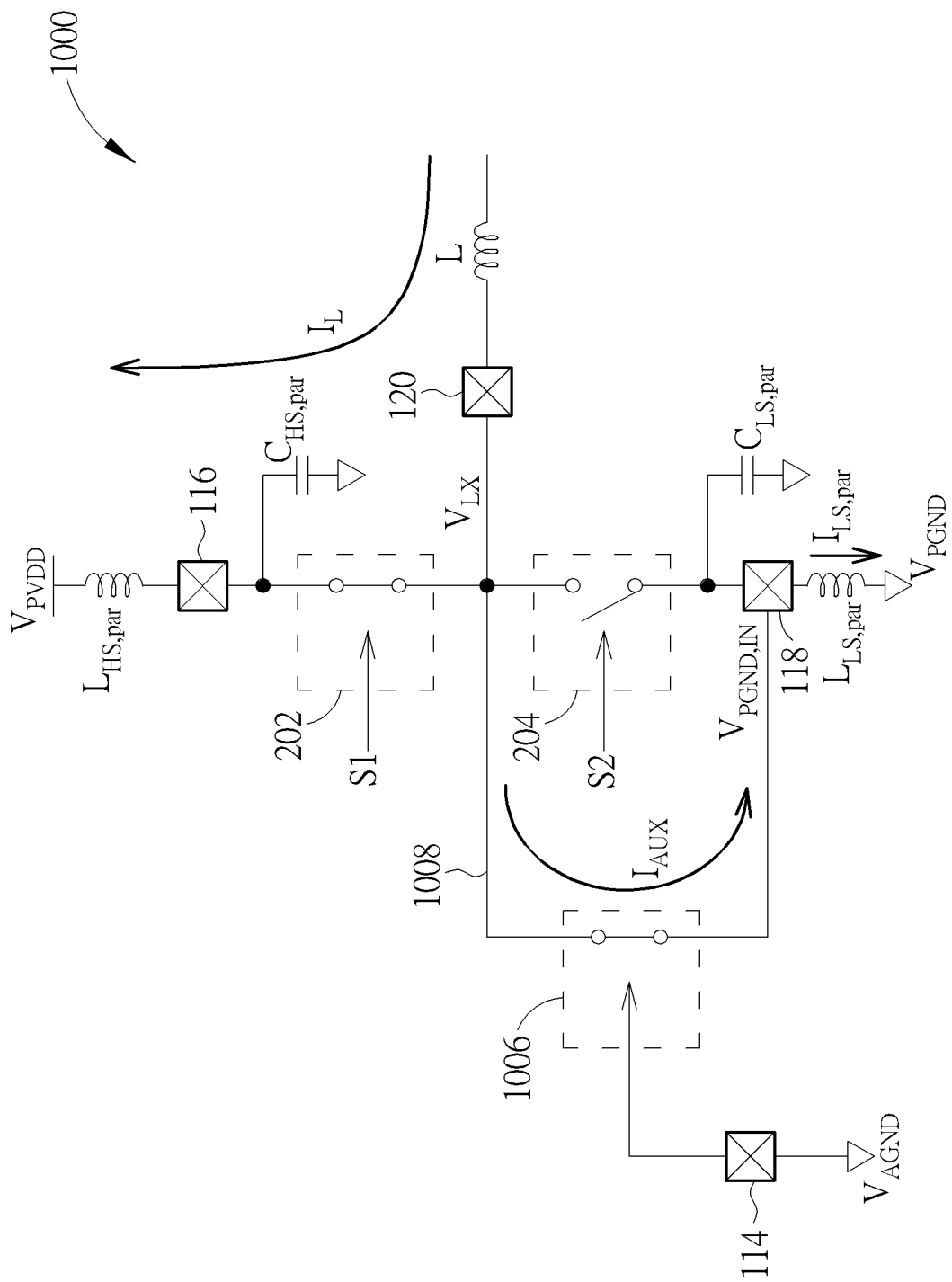
FIG. 12 is a diagram illustrating the switching regulator in FIG. 10 that operates during a second period within the voltage regulation cycle.

Please refer to FIG. 10 in conjunction with FIG. 12. FIG. 12 is a diagram illustrating the switching regulator 1000 in FIG. 10 that operates during a second period within the voltage regulation cycle. During the second period immediately following the first period, the switching control signal S2 is set for switching off the switch circuit 204 (particularly, NMOS transistor $M_{LS}$), and the switching control signal S1 is set for switching on the switch circuit 202 (particularly, PMOS transistor $M_{HS}$). Hence, the switching regulator 1000 generates the current $I_L$ passing through the inductor L, the switch circuit 202 (particularly, PMOS transistor $M_{HS}$), and the parasitic inductor $L_{HS,par}$. In this way, the pulsed voltage $V_{LX}$ has a transition from a low voltage level to a high voltage level. Since the switch circuit 204 (particularly, NMOS transistor $M_{LS}$) is controlled to be switched off and the current passing through the parasitic inductor $L_{LS,par}$ should be continuous, the parasitic inductor $L_{LS,par}$ still has the current $I_{LS,par}$ passing there through, thus decreasing the voltage level $V_{PGND,IN}$ at the first connection node of the switch circuit 204. In a case where the proposed protection circuit 1006 is omitted, the voltage level $V_{PGND,IN}$ at the first connection node of the switch circuit 204 is pulled low significantly. As a result, the absolute value of the drain-source voltage of the NMOS transistor $M_{LS}$ will exceed the SOA voltage, thus resulting in damage of the NMOS transistor $M_{LS}$.

To address this issue, the proposed protection circuit 1006 is implemented to provide SOA protection. When the current $I_{LS,par}$ passing through the parasitic inductor $L_{LS,par}$, the voltage level $V_{PGND,IN}$ at the first connection node of the switch circuit 204 is decreased to be lower than the ground voltage $V_{AGND}$ acting a gate voltage of the NMOS transistor $MN_{AUX}$, and the absolute value of the gate-source voltage of the NMOS transistor $MN_{AUX}$ is increased accordingly. Once the absolute value of the gate-source voltage of the NMOS transistor $MN_{AUX}$ exceeds an absolute value of a threshold voltage $|V_{TH}|$ of the NMOS transistor $MN_{AUX}$, the protection circuit 1006 (particularly, NMOS transistor $MN_{AUX}$) is automatically switched on, thereby enabling the auxiliary current path 1008 between the first connection node and the second connection node of the switch circuit 204. In other words, the protection circuit 1006 provides another current path for $I_{LS,par}$. Since the auxiliary current $I_{AUX}$ (which is apart of the current $I_{LS,par}$) passes through the auxiliary current path 1008, the voltage bouncing at the first connection node of the switch circuit 204 is mitigated. In this way, the absolute value of the drain-source voltage of the NMOS transistor $M_{LS}$ will not exceed the SOA voltage.

In above embodiment shown in FIG. 10, the protection circuit 1006 is implemented by NMOS transistor $MN_{AUX}$. However, this is for illustrative purposes only, and is not meant to be a limitation of the present invention. Alternatively, the protection circuit 1006 may be implemented by an NPN bipolar transistor or other transistor that can be selectively turned on according to difference between the auxiliary reference voltage (e.g., $V_{AGND}$) and the voltage level $V_{PGND,IN}$ at the first connection node of the switch circuit 204.

Figure 13:
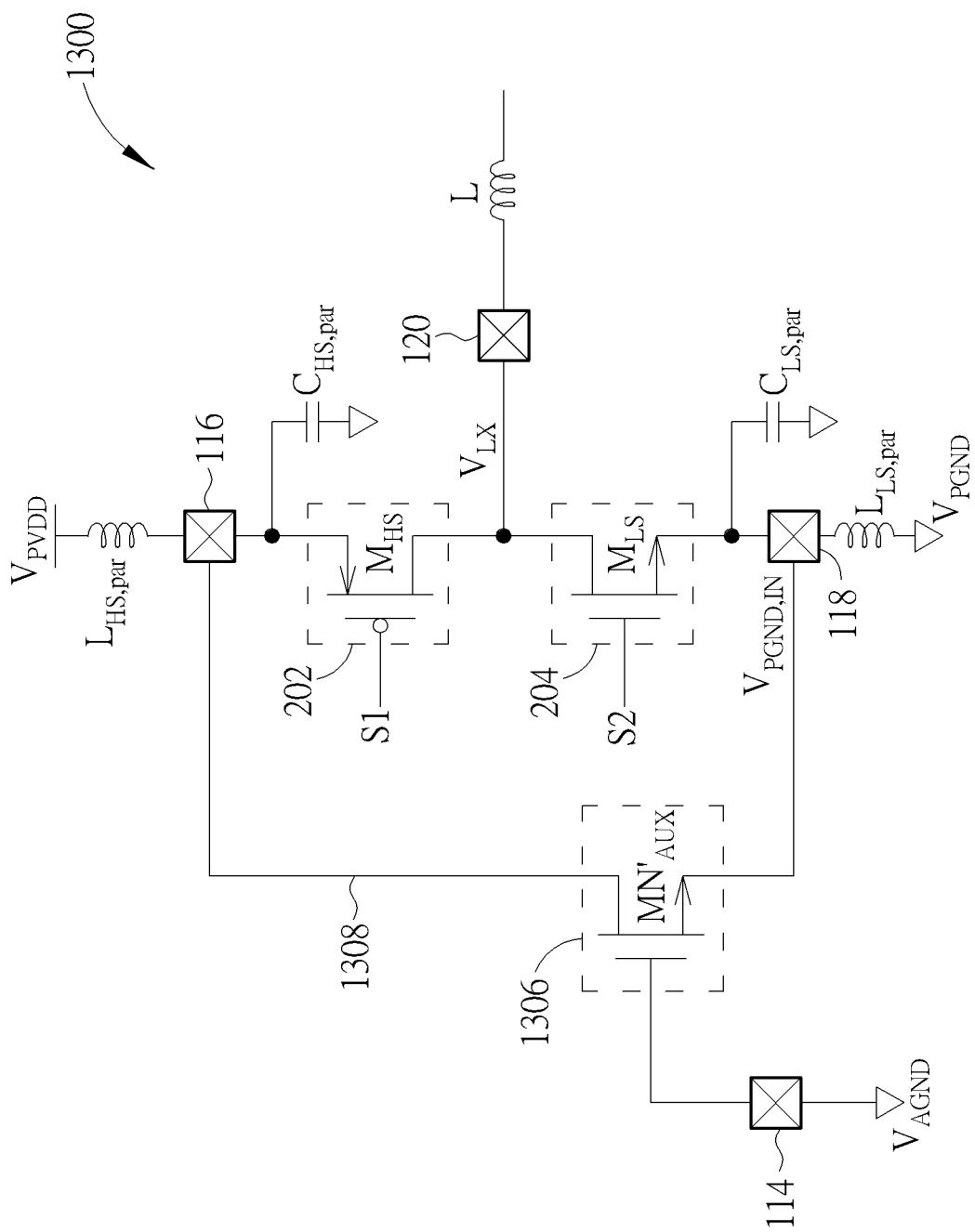
FIG. 13 is a diagram illustrating a second switching regulator with low-side SOA protection according to an embodiment of the present invention.

FIG. 13 is a diagram illustrating a second switching regulator with low-side SOA protection according to an embodiment of the present invention. The major difference between the switching regulators 1000 and 1300 is that the switching regulator 1300 has a protection circuit 1306 implemented by an auxiliary transistor that is an NMOS transistor $MN'_{AUX}$ with a source node coupled to the pin 118, a drain node coupled to the pin 116, and a gate node coupled to the pin 114. Hence, when an auxiliary current path 1308 is enabled, the power on the parasitic inductor $L_{LS,par}$ is not recycled to the output of the switching regulator 1300. Alternatively, the protection circuit 1306 may be implemented by an NPN bipolar transistor or other transistor that can be selectively turned on according to difference between the auxiliary reference voltage (e.g., $V_{AGND}$) and the voltage level $V_{PGND,IN}$ at the first connection node of the switch circuit 204.

Figure 14:
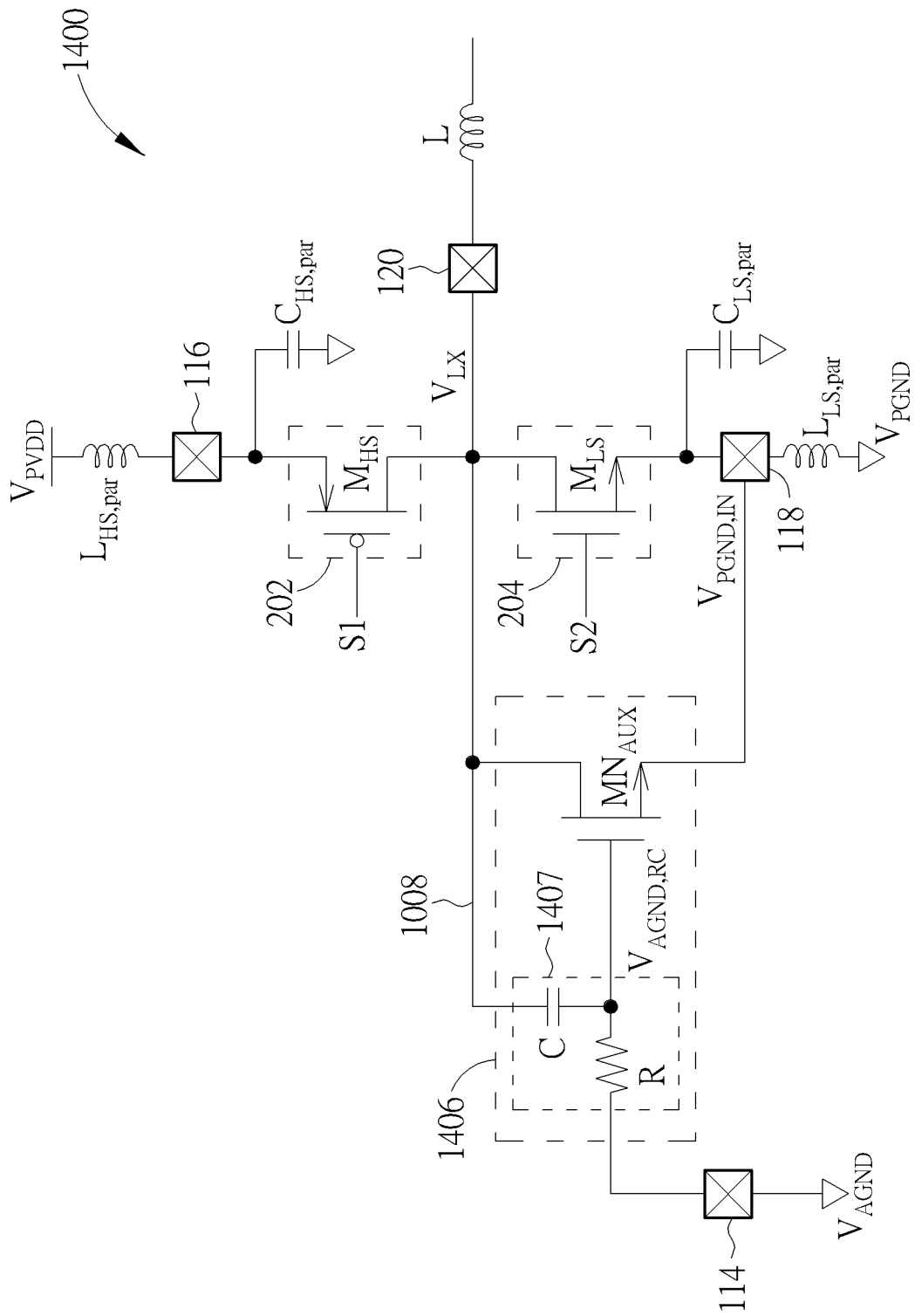
FIG. 14 is a diagram illustrating a third switching regulator with low-side SOA protection according to an embodiment of the present invention.

FIG. 14 is a diagram illustrating a third switching regulator with low-side SOA protection according to an embodiment of the present invention. The major difference between the switching regulators 1000 and 1400 is that the switching regulator 1400 has a protection circuit 1406 including a resistor-capacitor (RC) circuit 1407 and the aforementioned auxiliary transistor (e.g., NMOS transistor $MN_{AUX}$). The RC circuit 1407 includes a resistor R and a capacitor C. A first end of the resistor R is coupled to the auxiliary reference voltage (e.g., ground voltage $V_{AGND}$), and a second end of the resistor R is coupled to the control node of the auxiliary transistor (e.g., NMOS transistor $MN_{AUX}$). A first end of the capacitor C is coupled to the control node of the auxiliary transistor (e.g., NMOS transistor $MN_{AUX}$), and a second end of the capacitor C is coupled to one end of the inductor L. Alternatively, the auxiliary transistor (e.g., NMOS transistor $MN_{AUX}$) in the protection circuit 1406 may be implemented by an NPN bipolar transistor or other transistor that can be selectively turned on according to difference between the voltage level $V_{AGND,RC}$ at the control node of the auxiliary transistor and the voltage level $V_{PGND,IN}$ at the first connection node of the switch circuit 204.

During the second period of the voltage regulation cycle, the switching control signal S2 is set for switching off the switch circuit 204 (particularly, NMOS transistor $M_{LS}$) and the switching control signal S1 is set for switching on the switch circuit 202 (particularly, PMOS transistor $M_{HS}$). Hence, the pulsed voltage $V_{Lx}$ has a transition from a low voltage level to a high voltage level. Since the pulsed voltage $V_{Lx}$ is coupled to the control node of the auxiliary transistor (e.g., NMOS transistor $Mn_{AUX}$) through the RC circuit 1407, the voltage level $V_{AGND,RC}$ at the control node of the auxiliary transistor (e.g., NMOS transistor $MN_{AUX}$) is temporarily pulled high due to the pulsed voltage $V_{LX}$. After the voltage level $V_{AGND,RC}$ is temporarily pulled high by the pulsed voltage $V_{Lx}$, it will be pulled low by the auxiliary reference voltage (e.g., ground voltage $V_{AGND}$).

When the voltage level $V_{AGND,RC}$ is temporarily pulled high by the pulsed voltage $V_{LX}$, the gate-source voltage of the NMOS transistor $MN_{AUX}$ is increased for allowing higher current density on the auxiliary current path 1008. Hence, the current passing through the auxiliary current path 1008 is increased, resulting in a lower voltage decrement of the voltage level $V_{PGND,IN}$ at the first connection node of the switch circuit 204. In this way, the voltage bouncing at the first connection node of the switch circuit 204 is mitigated due to a smaller absolute value of the drain-source voltage of the NMOS transistor $M_{LS}$. Compared to the design of the protection circuit 1006, the design of the protection circuit 1406 can provide better SOA protection for the switch circuit 204 (particularly, NMOS transistor $M_{LS}$).

Figure 15:
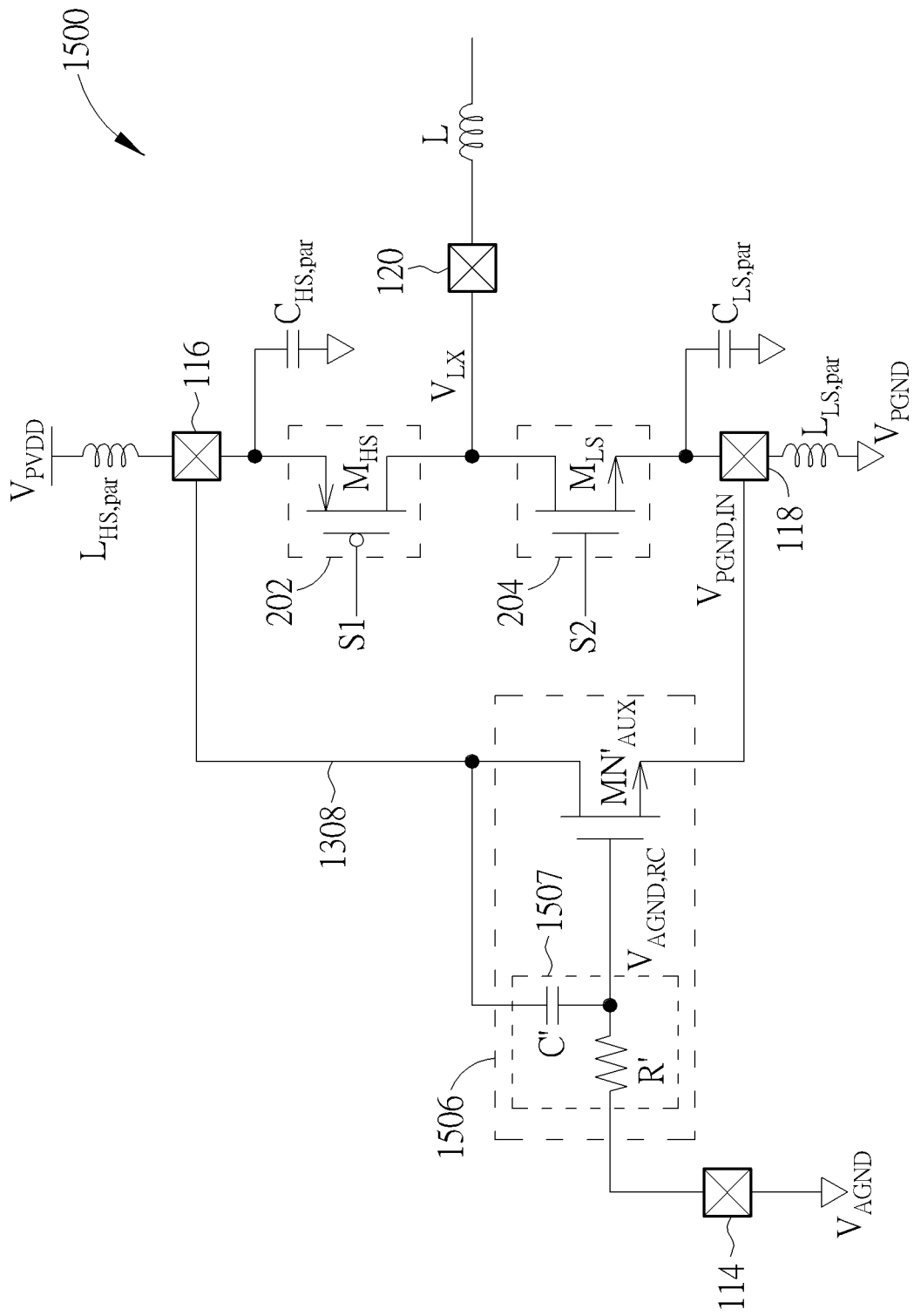
FIG. 15 is a diagram illustrating a fourth switching regulator with low-side SOA protection according to an embodiment of the present invention.

FIG. 15 is a diagram illustrating a fourth switching regulator with low-side SOA protection according to an embodiment of the present invention. The major difference between the switching regulators 1300 and 1500 is that the switching regulator 1500 has a protection circuit 1506 including a resistor-capacitor (RC) circuit 1507 and the aforementioned auxiliary transistor (e.g., NMOS transistor $M'_{AUX}$). The RC circuit 1507 includes a resistor R' and a capacitor C'. A first end of the resistor R' is coupled to the auxiliary reference voltage (e.g., ground voltage $V_{AGND}$), and a second end of the resistor R' is coupled to the control node of the auxiliary transistor (e.g., NMOS transistor $MN'_{AUX}$). A first end of the capacitor C' is coupled to the control node of the auxiliary transistor (e.g., NMOS transistor $MN'_{AUX}$), and a second end of the capacitor C' is coupled to one reference voltage (e.g., supply voltage $P_{PVDD}$) Alternatively, the auxiliary transistor (e.g., NMOS transistor $MN'_{AUX}$) in the protection circuit 1506 may be implemented by an NPN bipolar transistor or other transistor that can be selectively turned on according to difference between the voltage level $V_{AGND,RC}$ at the control node of the auxiliary transistor and the voltage level $V_{PGND,IN}$ at the first connection node of the switch circuit 204. As a skilled person in the art can readily understand the principle of the protection circuit 1506 after reading above paragraphs directed to the protection circuit 1406, further description is omitted here for brevity.

In above embodiments, switch circuits 202 and 204 may be implemented by MOS transistors. However, these are for illustrative purposes only, and are not meant to be limitations of the present invention. Alternatively, at least one of the switch circuits 202 and 204 may be implemented by a diode or a schottky diode. To put it simply, the present invention has no limitations on the implementation of switch circuits 202 and 204. Hence, each of the switch circuits 202 and 204 may be implemented by any circuit element with a switchable conductance state. These alternative designs all fall within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A switching regulator comprising:
    a first switch circuit, having a first connection node coupled to a first reference voltage, and a second connection node coupled to one end of an inductor;
    a second switch circuit, having a first connection node coupled to a second reference voltage that is different from the first reference voltage, and a second connection node coupled to said one end of the inductor; and
    a protection circuit, arranged to sense a voltage level at the first connection node of the first switch circuit, and selectively enable an auxiliary current path in response to the voltage level at the first connection node of the first switch circuit, wherein the auxiliary current path and at least the first switch circuit are arranged in a parallel connection fashion;
    wherein the protection circuit disables the auxiliary current path in response to a difference between an auxiliary reference voltage and the voltage level at the first connection node of the first switch circuit, during a period in which the first switch circuit is switched on.

2. The switching regulator of claim 1, wherein the first reference voltage is a supply voltage, and the second reference voltage is a ground voltage.

3. The switching regulator of claim 1, wherein the first reference voltage is a ground voltage, and the second reference voltage is a supply voltage.

4. The switching regulator of claim 1, wherein the protection circuit is further arranged to receive the auxiliary reference voltage, and automatically enables the auxiliary current path according to the difference between the auxiliary reference voltage and the voltage level at the first connection node of the first switch circuit.

5. The switching regulator of claim 4, wherein the switching regulator is implemented in a chip, the protection circuit receives the auxiliary reference voltage via one pin of the chip, and the first switch circuit receives the first reference voltage via another pin of the chip.

6. The switching regulator of claim 5, wherein a noise level of the auxiliary reference voltage is lower than a noise level of the first reference voltage.

7. The switching regulator of claim 4, wherein the protection circuit comprises:
    an auxiliary transistor, having a control node arranged to receive the auxiliary reference voltage, a first connection node coupled to the first connection node of the first switch circuit, and a second connection node coupled to said one end of the inductor.

8. The switching regulator of claim 7, wherein a voltage level at the control node of the auxiliary transistor is constant.

9. The switching regulator of claim 7, wherein the protection circuit further comprises:
    a resistor—capacitor (RC) circuit, having a resistor and a capacitor, wherein a first end of the resistor is coupled to the auxiliary reference voltage, a second end of the resistor is coupled to the control node of the auxiliary transistor, a first end of the capacitor is coupled to the control node of the auxiliary transistor, and a second end of the capacitor is coupled to said one end of the inductor.

10. The switching regulator of claim 4, wherein the protection circuit comprises:
an auxiliary transistor, having a control node arranged to receive the auxiliary reference voltage, a first connection node coupled to the first connection node of the first switch circuit, and a second connection node coupled to the second reference voltage.

11. A power management integrated circuit (PMIC) comprising:
a first pin, arranged to receive a first reference voltage;
a second pin, arranged to receive a second reference voltage that is different from the first reference voltage;
a third pin, arranged to output a pulsed voltage; and
a switching regulator, arranged to generate the pulsed voltage, wherein the switching regulator comprises:
a first switch circuit, having a first connection node coupled to the first pin, and a second connection node coupled to the third pin;
a second switch circuit, having a first connection node coupled to the second pin, and a second connection node coupled to the third pin; and
a protection circuit, arranged to sense a voltage level at the first connection node of the first switch circuit, and selectively enable an auxiliary current path in response to the voltage level at the first connection node of the first switch circuit, wherein the auxiliary current path and at least the first switch circuit are arranged in a parallel connection fashion;
wherein the protection circuit disables the auxiliary current path in response to a difference between an auxiliary reference voltage and the voltage level at the first connection node of the first switch circuit, during a period in which the first switch circuit is switched on.

12. The PMIC of claim 11, wherein the first reference voltage is a supply voltage, and the second reference voltage is a ground voltage.

13. The PMIC of claim 11, wherein the first reference voltage is a ground voltage, and the second reference voltage is a supply voltage.

14. The PMIC of claim 11, further comprising:
a fourth pin, arranged to receive the auxiliary reference voltage;
wherein the protection circuit is further coupled to the fourth pin, and automatically enables the auxiliary current path according to the difference between the auxiliary reference voltage and the voltage level at the first connection node of the first switch circuit.

15. The PMIC of claim 14, wherein a noise level of the auxiliary reference voltage is lower than a noise level of the first reference voltage.

16. The PMIC of claim 14, wherein the protection circuit comprises:
an auxiliary transistor, having a control node coupled to the fourth pin, a first connection node coupled to the first connection node of the first switch circuit, and a second connection node coupled to the third pin.

17. The PMIC of claim 16, wherein a voltage level at the control node of the auxiliary transistor is constant.

18. The PMIC of claim 16, wherein the protection circuit further comprises:
a resistor—capacitor (RC) circuit, having a resistor and a capacitor, wherein a first end of the resistor is coupled to the fourth pin, a second end of the resistor is coupled to the control node of the auxiliary transistor, a first end of the capacitor is coupled to the control node of the auxiliary transistor, and a second end of the capacitor is coupled to the third pin.

19. The PMIC of claim 14, wherein the protection circuit comprises:
an auxiliary transistor, having a control node coupled to the fourth pin, a first connection node coupled to the first connection node of the first switch circuit, and a second connection node coupled to the third pin.

* * * * *